(12) United States Patent
You

(10) Patent No.: US 11,269,769 B2
(45) Date of Patent: Mar. 8, 2022

(54) MEMORY SYSTEM AND METHOD OF OPERATING THE SAME

(71) Applicant: SK hynix Inc., Gyeonggi-do (KR)

(72) Inventor: Byoung Sung You, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/788,533

(22) Filed: Feb. 12, 2020

(65) Prior Publication Data

US 2021/0026766 A1  Jan. 28, 2021

(30) Foreign Application Priority Data

Jul. 24, 2019  (KR) .................. 10-2019-0089862

(51) Int. Cl.
  *G06F 12/02* (2006.01)
  *G06F 9/54* (2006.01)
  *G11C 16/34* (2006.01)
  *G06F 13/16* (2006.01)

(52) U.S. Cl.
  CPC .......... *G06F 12/0253* (2013.01); *G06F 9/546* (2013.01); *G06F 12/0246* (2013.01); *G06F 12/0292* (2013.01); *G06F 13/1673* (2013.01); *G11C 16/344* (2013.01); *G06F 2212/7209* (2013.01)

(58) Field of Classification Search
  None
  See application file for complete search history.

(56) References Cited

U.S. PATENT DOCUMENTS

| | | | |
|---|---|---|---|
| 8,572,311 B1* | 10/2013 | Shalvi | G06F 11/1016 711/103 |
| 2007/0033330 A1* | 2/2007 | Sinclair | G06F 3/0643 711/103 |
| 2009/0055575 A1* | 2/2009 | Hanhimaki | G11C 16/10 711/103 |
| 2012/0284587 A1* | 11/2012 | Yu | G06F 3/0631 714/773 |
| 2017/0132245 A1* | 5/2017 | Ioannou | G06F 12/1009 |
| 2017/0286286 A1* | 10/2017 | Szubbocsev | G06F 3/0688 |
| 2018/0102172 A1* | 4/2018 | Yi | G06F 11/1048 |
| 2018/0121344 A1* | 5/2018 | Seo | G06F 12/0246 |
| 2019/0317688 A1* | 10/2019 | Cheon | G06F 3/0659 |
| 2020/0004453 A1* | 1/2020 | Rori | G06F 12/0246 |
| 2020/0089603 A1* | 3/2020 | Jin | G06F 3/061 |
| 2020/0394136 A1* | 12/2020 | Byun | G06F 12/0804 |

FOREIGN PATENT DOCUMENTS

| | | |
|---|---|---|
| KR | 10-2012-0005836 | 1/2012 |
| KR | 10-2017-0035155 | 3/2017 |

* cited by examiner

*Primary Examiner* — Charles Rones
*Assistant Examiner* — Ryan Dare
(74) *Attorney, Agent, or Firm* — IP & T Group LLP

(57) ABSTRACT

Provided herein may be a memory system and a method of operating the same. The memory system may include a memory device configured to include a plurality of memory blocks and copy data from victim blocks among the plurality of memory blocks into a target memory block during a garbage collection operation, and a memory controller configured to control the memory device to perform the garbage collection operation, and configured to control the memory device, during the garbage collection operation, to erase the data stored in the victim blocks using a multi-erase method.

18 Claims, 13 Drawing Sheets

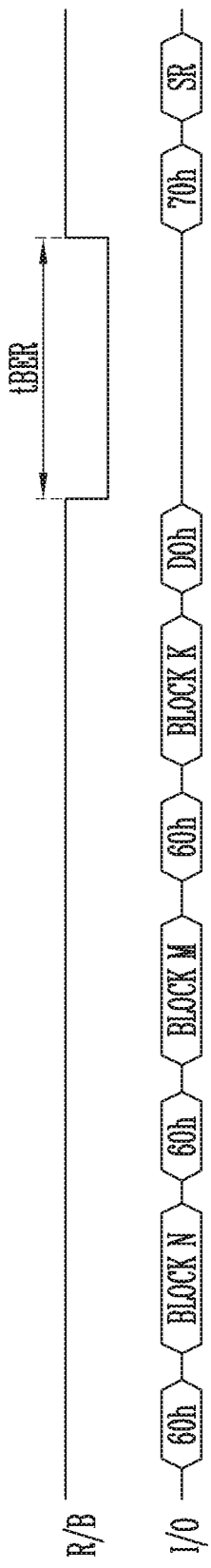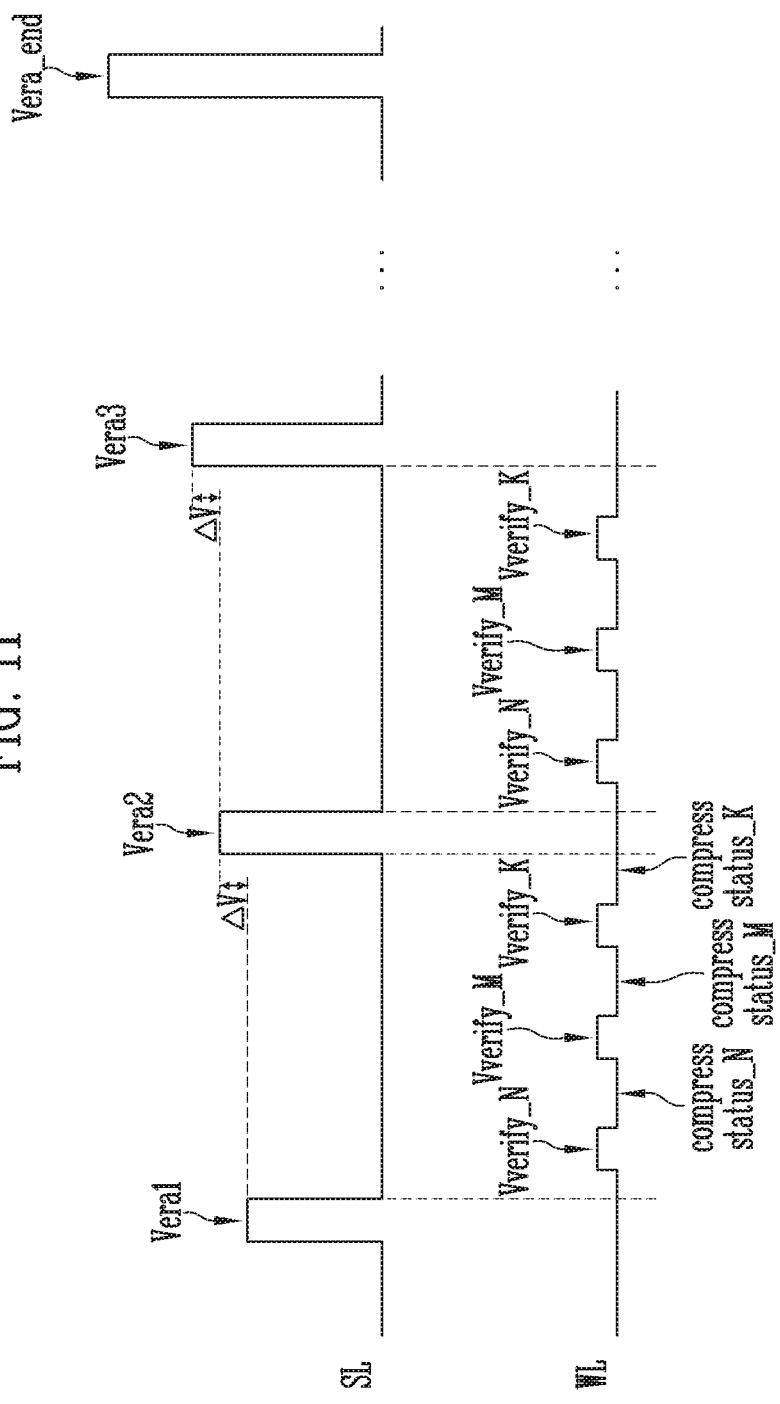

FIG. 12

| Victim Blocks | | | |
|---|---|---|---|
| 0 | 1 | 100 | 102 |
| 2 | 3 | 4 | 201 |
| 101 | 200 | 5 | 6 |
| ⋮ | | | |
| 10 | 150 | 9 | 140 |

⇒

| Target Block | | | |
|---|---|---|---|
| 0 | 1 | 2 | 3 |
| 4 | 5 | 6 | 7 |
| 8 | 9 | 10 | 11 |
| ⋮ | | | |
| | | | |

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2019-0089862 filed on Jul. 24, 2019, which is incorporated herein by reference in its entirety.

BACKGROUND

1. Field of Invention

Various embodiments of the present disclosure relate to an electronic device, and more particularly, to a memory system and a method of operating the memory system.

2. Description of Related Art

Recently, the paradigm for a computer environment has been converted into ubiquitous computing so that computer systems can be used anytime and anywhere. Due to this, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device for portable electronic devices.

A data storage device using a memory device provides various advantages in that, since there is no mechanical driving part, stability and durability are excellent, an information access speed is very high, and power consumption is low. Examples of data storage devices having such advantages include a universal serial bus (USB) memory device, memory cards having various interfaces, and a solid state drive (SSD).

Memory devices are chiefly classified into volatile memory devices and nonvolatile memory devices.

The nonvolatile memory device has comparatively low write and read speed, but retains data stored therein even when the supply of power is interrupted. Therefore, the nonvolatile memory device is used to store data which must be retained regardless of whether power is supplied. Examples of a nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory is classified into a NOR type and a NAND type.

SUMMARY

Various embodiments of the present disclosure are directed to a memory system that may improve a garbage collection operation thereof and a method of operating the memory system.

An embodiment of the present disclosure may provide for a memory system. The memory system may include a memory device having a plurality of memory blocks and configured to store data that is stored in victim blocks among the plurality of memory blocks, into a target memory block during a garbage collection operation, and a memory controller configured to control the memory device to perform the garbage collection operation, and, during the garbage collection operation, to erase the data stored in the victim blocks using a multi-erase method.

An embodiment of the present disclosure may provide for a memory system. The memory system may include a memory device having a plurality of memory blocks and configured to store data that is in victim blocks among the plurality of memory blocks, into a target memory block among the plurality of memory blocks, and erasing the data stored in the victim memory blocks using a single-erase method or a multi-erase method during a garbage collection operation, and a memory controller configured to control the memory device to perform the garbage collection operation, set the erase method for the victim blocks to the single-erase method or the multi-erase method based on an amount of valid data stored in the victim blocks during the garbage collection operation, and control the memory device to erase the data stored in the victim blocks using the set erase method.

An embodiment of the present disclosure may provide for a method of operating a memory system. The method may include determining whether to perform a garbage collection operation, based on a number of free blocks among a plurality of memory blocks included in a memory device, when it is determined that the garbage collection operation is to be performed, selecting victim blocks and a target memory block from among the plurality of memory blocks, reading valid data stored in the victim blocks and copying the read valid data into the target memory block, and erasing the data stored in the victim blocks using a single-erase method or a multi-erase method based on an amount of valid data.

An embodiment of the present disclosure may provide for a method of operating a memory system. The method may include calculating a number of the free blocks; writing the valid data stored in the victim blocks into the free blocks based on a background operation of the memory system, if the number of the free blocks is between a first value and a second value, wherein the second value is lower than the first value; calculating a number of the victim blocks, if the number of the free blocks is less than the second value; writing the valid data stored in the victim blocks into the free blocks based on a foreground operation of the memory system after calculating the number of the victim blocks; erasing the valid data from the victim blocks based on a multi-erase method, if the number of victim blocks is greater than a third value; and erasing the valid data from the victim blocks based on a single-erase method, if the number of victim blocks is less than or equal to the third value.

These and other features and advantages of the present disclosure will become apparent to those skilled in the art of from the following detailed description in conjunction with the following drawings.

BRIEF DESCRIPTION OF THE DRAWINGS

FIG. 10 is a timing diagram of an erase command, a block address, and a ready/busy signal for describing a multi-erase operation according to various embodiments of the present disclosure.

FIG. 11 is a waveform diagram of signals for describing a multi-erase operation according to various embodiments of the present disclosure.

FIG. 12 illustrates a map table for a target memory block during a garbage collection operation according to various embodiments of the present disclosure.

DETAILED DESCRIPTION

Figure 1:
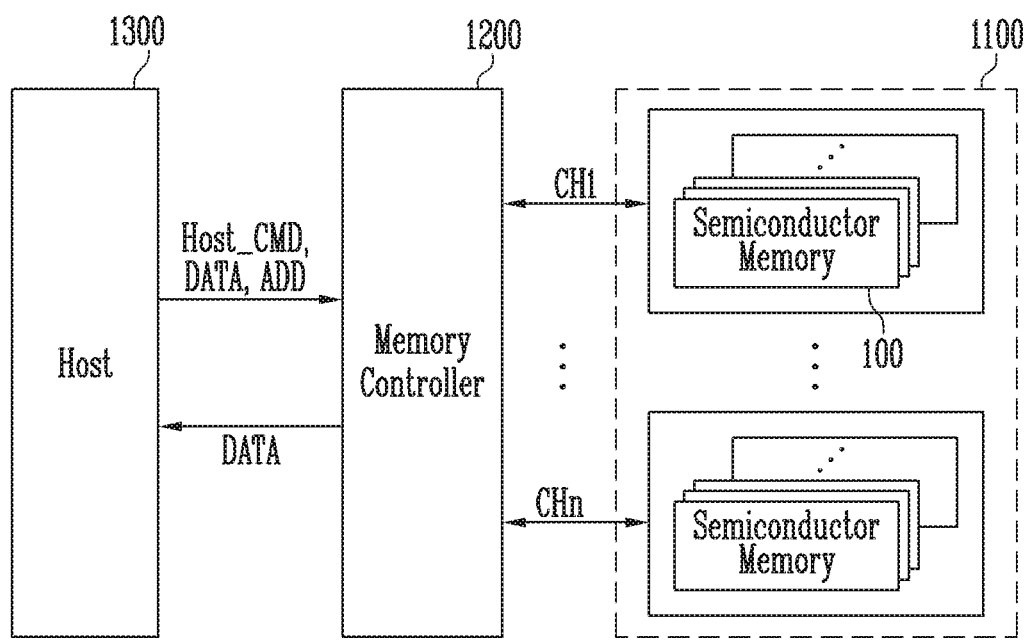
FIG. 1 is a block diagram illustrating a memory system according to various embodiments of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described in detail based on embodiments. The present disclosure may, however, be embodied in many different forms and should not be construed as being limited to only the embodiments set forth herein, but should be construed as covering modifications, equivalents or alternatives falling within the spirit and technical scope of the present disclosure. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art, and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description to make the subject matter of the present disclosure clear.

Various embodiments of the present disclosure will now be described more fully hereinafter with reference to the accompanying drawings, in which preferred embodiments of the present disclosure are shown, so that those of ordinary skill in the art can easily carry out the technical idea of the present disclosure.

FIG. 1 is a block diagram illustrating a memory system according to various embodiments of the present disclosure.

Referring to FIG. 1, a memory system 1000 may include a memory device 1100, a memory controller 1200, and a host 1300. The memory device 1100 may include a plurality of semiconductor memories 100. The plurality of semiconductor memories 100 may be divided into a plurality of groups. In an embodiment of the present disclosure, although the host 1300 is illustrated and described as being included in the memory system 1000, the memory system 1000 may be configured to include only the memory controller 1200 and the memory device 1100, and the host 1300 may be configured to be arranged outside the memory system 1000.

In FIG. 1, it is illustrated that each memory group of a plurality of memory groups in the memory device 1100 individually communicates with the memory controller 1200 through first to n-th channels CH1 to CHn. Each semiconductor memory 100 will be described in detail later with reference to FIG. 4.

Each memory group may communicate with the memory controller 1200 through one common channel. The memory controller 1200 may control the semiconductor memories 100 of the memory device 1100 through the plurality of channels CH1 to CHn.

The memory controller 1200 may be coupled between the host 1300 and the memory device 1100. The memory controller 1200 may access the memory device 1100 in response to a request from the host 1300. For example, the memory controller 1200 may control a read operation, a write operation, an erase operation, and a background operation of the memory device 1100 in response to a host command Host_CMD received from the host 1300. The host 1300 may transmit to the memory controller 1200, an address ADD and data DATA together with the host command Host_CMD during a write operation, and may transmit to the memory controller 1200, an address ADD together with the host command Host_CMD during a read operation. The memory controller 1200 may transmit read data DATA to the host 1300 during the read operation. The memory controller 1200 may control the memory device 1100 so that the memory device 1100 can perform a garbage collection operation (GC), for example, an operation of copying data, stored in arbitrary memory blocks (e.g., victim blocks), into an additional arbitrary memory block (e.g., a target memory block), and then processes the copied data. During the garbage collection operation, the memory controller 1200 may erase data stored in the victim blocks, thus securing free blocks. Here, the memory controller 1200 may rapidly secure the free blocks by controlling the memory device 1100 so that the data stored in victim blocks can be erased using a multi-erase method.

The memory controller 1200 may provide an interface between the memory device 1100 and the host 1300. The memory controller 1200 may run firmware for controlling the memory device 1100.

The host 1300 may include a portable electronic device, such as a computer, a personal digital assistant (PDA), a portable multimedia player (PMP), an MP3 player, a camera, a camcorder, or a mobile phone. The host 1300 may request a write operation, a read operation or an erase operation of the memory system 1000 through the host commands Host_CMD. The host 1300 may transmit a host command Host_CMD corresponding to a write command, data DATA, and an address ADD to the memory controller 1200 to perform a write operation of the memory device 1100, and may transmit a host command Host_CMD corresponding to a read command and an address ADD to the memory controller 1200 to perform a read operation of the memory device 1100. Here, the address ADD may be a logical address of data.

The memory controller 1200 and the memory device 1100 may be integrated into a single semiconductor device. In an exemplary embodiment, the memory controller 1200 and the memory device 1100 may be integrated into a single semiconductor device to form a memory card. For example, the memory controller 1200 and the memory device 1100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The memory controller 1200 and the memory device 1100 may be integrated into a single semiconductor device to form a solid state drive (SSD). The SSD may include a storage device configured to store data in each semiconductor memory.

In an embodiment, the memory system 1000 may be provided as one of various elements of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system.

In an exemplary embodiment, the memory device 1100 or the memory system 1000 may be mounted in various types of packages. For example, the memory device 1100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 2:
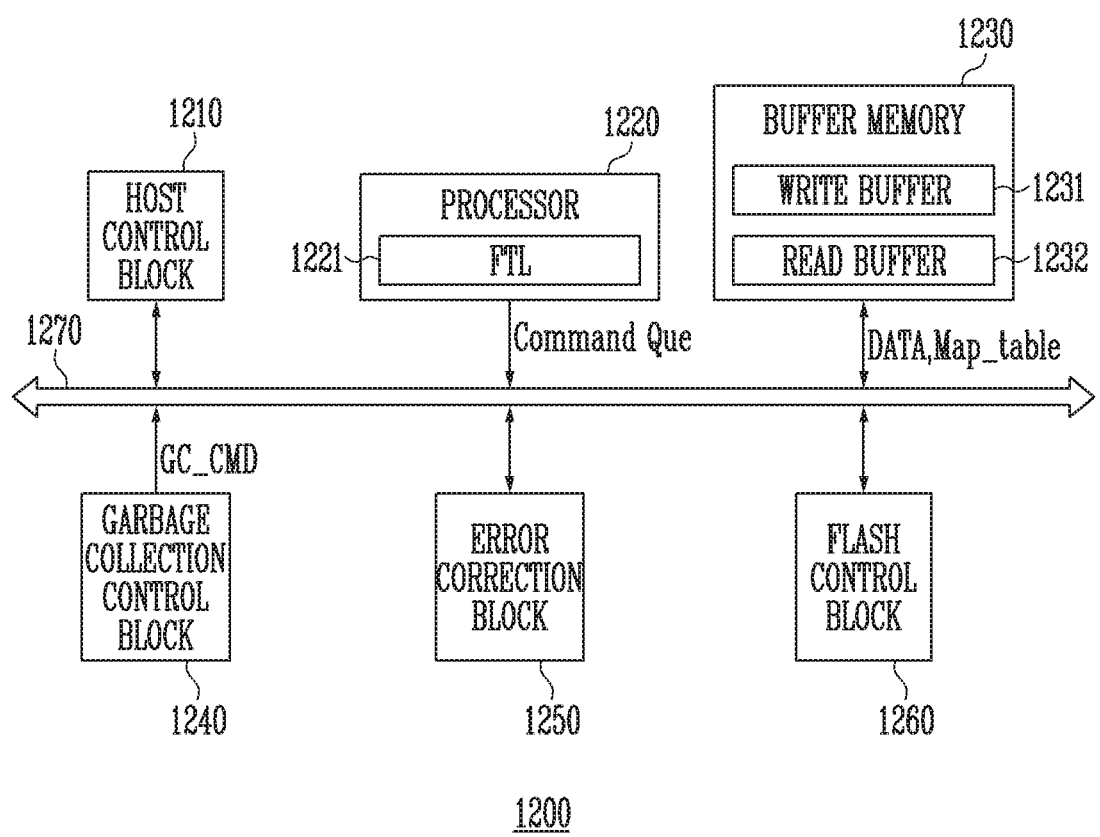
FIG. 2 is a block diagram illustrating the configuration of a memory controller of FIG. 1 according to various embodiments of the present disclosure.

FIG. 2 is a block diagram illustrating the configuration of the memory controller of FIG. 1.

Referring to FIG. 2, the memory controller 1200 may include a host control block 1210, a processor 1220, a buffer memory 1230, a garbage collection control block 1240, an error correction block 1250, a flash control block 1260, and a bus 1270.

The bus 1270 may provide a channel between components of the memory controller 1200.

The host control block 1210 may control transmission of data between the host 1300 of FIG. 1 and the buffer memory 1230. In an example, the host control block 1210 may control the operation of buffering the data input from the host 1300 in the buffer memory 1230. In an example, the host control block 1210 may control the operation of outputting the data, buffered in the buffer memory 1230, to the host 1300.

Further, the host control block 1210 may transmit the host command and the address received from the host 1300 to the processor 1220.

The host control block 1210 may include a host interface.

The processor 1220 may control the overall operation of the memory controller 1200 and perform a logical operation. The processor 1220 may communicate with the host 1300 of FIG. 1 through the host control block 1210, and may communicate with the memory device 1100 of FIG. 1 through the flash control block 1260. Also, the processor 1220 may control the operation of the memory system 1000 by using the buffer memory 1230 as a working memory or a cache memory. The processor 1220 may generate a command queue (Command Que) by realigning a plurality of host commands, received from the host 1300, depending on their priorities to control the flash control block 1260.

The processor 1220 may include a flash translation layer (hereinafter referred to as an 'FTC') 1221.

The flash translation layer (FTL) 1221 may run firmware. The firmware may be stored either in an additional memory (not illustrated), which is directly coupled to the buffer memory 1230 or the processor 1220, or in a storage space in the processor 1220. Also, the FTL 1221 may map a physical address, corresponding to an address (e.g., a logical address) from the host 1300 of FIG. 1, to the logical address during a write operation. Further, the FTL 1221 may check the physical address mapped to the logical address input from the host 1300 during a read operation. The FTL 1221 may update a mapping table (map table) for a target memory block during a garbage collection operation. The FTL 1221 may realign addresses so that adjacent logical addresses are mapped to adjacent physical addresses during an operation of updating the map table for the target memory block. For example, the FTL 1221 may realign the logical addresses in a gradually increasing order (i.e., in ascending order), and may sequentially map the realigned logical addresses to respective physical addresses in corresponding order.

Furthermore, the FTL 1221 may generate a command queue (Command Que) for controlling the flash control block 1260 in response to a host command received from the host 1300.

The buffer memory 1230 may be used as a working memory or a cache memory of the processor 1220. The buffer memory 1230 may store codes and commands that are executed by the processor 1220. The buffer memory 1230 may store data that is processed by the processor 1220.

The buffer memory 1230 may include a write buffer 1231 and a read buffer 1232. The write buffer 1231 temporarily stores data DATA, received together with a write command from the host 1300 and thereafter transmits the temporarily stored data DATA to the memory device 1100. The read buffer 1232 may temporarily store data DATA, received from the memory device 1100, and then transmits the temporarily stored data DATA to the host 1300 during a read operation. Furthermore, during a garbage collection operation, the read buffer 1232 may temporarily store valid data, received from selected memory blocks of the memory device 1100, that is, victim blocks, and then transmits the temporarily stored valid data to the target memory block of the memory device 1100.

The buffer memory 1230 may store map tables for memory blocks included in the memory device 1100.

The buffer memory 1230 may include a static RAM (SRAM) or a dynamic RAM (DRAM).

During the garbage collection operation, the garbage collection control block 1240 may select victim blocks and a target memory block from among the plurality of memory blocks included in the memory device 1100, and may control the flash control block 1260 and the buffer memory 1230 so that valid data stored in the victim blocks is stored in the target memory block. The garbage collection control block 1240 may control the flash control block 1260 to perform, during the garbage collection operation, the garbage collection operation using a background operation or a foreground operation of the memory system based on the performance of the memory system. Also, the garbage collection control block 1240 may control the flash control block 1260 so that, during the garbage collection operation, data of victim blocks can be erased by a multi-erase operation or a single-erase operation, which is determined based on the number of victim blocks (i.e., a victim block count) or the amount of valid data stored in the victim blocks. The multi-erase operation may indicate an erase operation of simultaneously erasing data stored in a plurality of victim blocks, and the single-erase operation may indicate an erase operation of sequentially erasing data stored in a plurality of victim blocks.

In an example, the garbage collection control block 1240 may be included in the processor 1220 as a component of the processor 1220.

The error correction block 1250 may perform error correction. The error correction block 1250 may perform Error Correction Code (ECC) encoding based on data to be written to the memory device 1100 of FIG. 1 through the flash control block 1260. The ECC-encoded data may be transferred to the memory device 1100 through the flash control block 1260. The error correction block 1250 may perform ECC decoding on data received from the memory device 1100 through the flash control block 1260. In an example, the error correction block 1250 may be included, as a component of the flash control block 1260, in the flash control block 1260.

The flash control block 1260 may generate and output an internal command for controlling the memory device 1100 in response to the command queue (Command Que) generated by the processor 1220. The flash control block 1260 may control a write operation by transmitting the data buffered in the write buffer 1231 of the buffer memory 1230 to the memory device 1100 during the write operation. In an example, during a read operation, the flash control bock 1260 may control an operation of buffering the data read from the memory device 1100, in the read buffer 1232 of the buffer memory 1230 in response to the command queue (Command Que). Further, during the garbage collection operation, the flash control block 1260 may control the memory device 1100 to perform the garbage collection operation under the control of the garbage collection control block 1240. For example, during the garbage collection operation the flash control block 1260 may control the memory device 1100, to read valid data from a plurality of victim blocks selected from among a plurality of memory blocks included in the memory device 1100. Then the flash control block 1260 may receive the read valid data from the memory device 1100 to store the read valid data into the read buffer 1232 of the buffer memory 1230. Furthermore, the flash control block 1260 may control the memory device 1100 to store the valid data stored in the read buffer 1232 into a target memory block among the plurality of memory blocks included in the memory device 1100. In addition, the flash control block 1260 may control the memory device 1100 to perform an erase operation on a plurality of victim blocks, and may also control the memory device 1100 to perform the erase operation using a multi-erase method or a single-erase method that is set by the garbage collection control block 1240.

The flash control block 1260 may include a flash interface.

Figure 3:
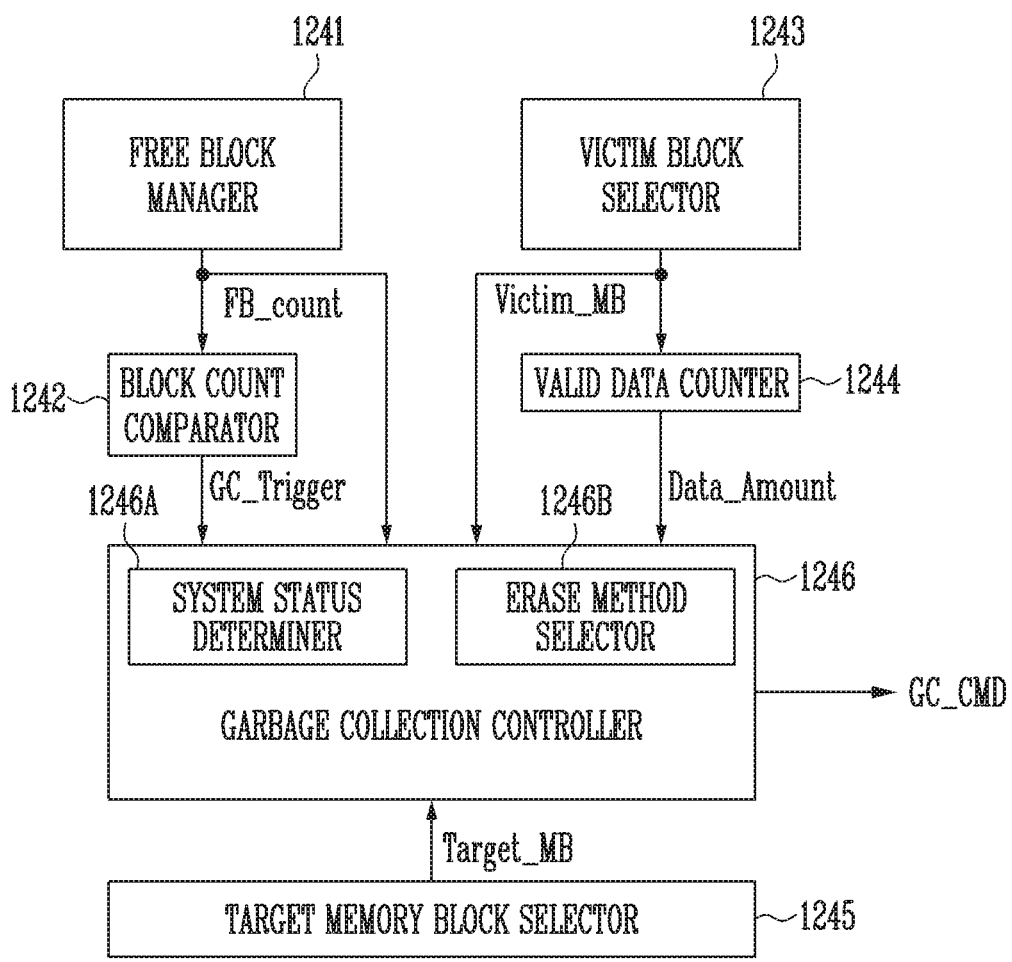
FIG. 3 is a block diagram illustrating the configuration of a garbage collection control block of FIG. 2 according to various embodiments of the present disclosure.

FIG. 3 is a block diagram illustrating the configuration of the garbage collection control block of FIG. 2.

Referring to FIG. 3, the garbage collection control block 1240 may include a free block manager 1241, a block count comparator 1242, a victim block selector 1243, a valid data counter 1244, a target memory block selector 1245, and a garbage collection controller 1246.

The free block manager 1241 may manage a plurality of free blocks among a plurality of memory blocks included in a memory device (e.g., 1100 of FIG. 1). A free block is in an empty memory block state in which there is no data due to an erase operation having been performed. Further, the free block manager 1241 may notify the block count comparator 1242 of the number of free blocks (i.e., a free block count: FB_count).

The block count comparator 1242 may receive the number of free blocks (i.e., a free block count) FB_count from the free block manager 1241, and may compare the received free block count FB_count with a first set number. When the received free block count FB_count is less than the first set number, the block count comparator 1242 may generate a garbage collection trigger signal GC_Trigger for performing a garbage collection operation, and may output the garbage collection trigger signal GC_Trigger to the garbage collection controller 1246.

The victim block selector 1243 may select two or more memory blocks in which valid data is stored, among the plurality of memory blocks included in the memory device (e.g., 1100 of FIG. 1), as victim blocks, and may output information about the victim blocks Victim_MB to the valid data counter 1244 and the garbage collection controller 1246. During the victim block select operation, the victim block selector 1243 may select the victim blocks in consideration of the amount of valid data stored, the time elapsed since a program operation is completed, etc. For example, the victim block selector 1243 may preferentially select, as the victim blocks, memory blocks in which a small amount of valid data is stored and have a long time elapsed since the program operation is completed. The victim block selector 1243 may adjust the number of memory blocks to be selected as victim blocks depending on the free block count.

The valid data counter 1244 may receive the information about victim blocks Victim_MB from the victim block selector 1243, count the total amount of valid data stored in the victim blocks, and then output valid data information Data_Amount.

The target memory block selector 1245 may select a target memory block to store data during the garbage collection operation, from among free blocks managed by the free block manager 1241, and may output information about the target memory block Target_MB to the garbage collection controller 1246.

The garbage collection controller 1246 may be activated in response to the garbage collection trigger signal GC_Trigger, and may generate a garbage collection command GC_CMD which controls performing the garbage collection operation in response to the free block count FB_count, the information about victim blocks Victim_MB, and the valid data information Data_Amount.

The garbage collection controller 1246 may include a system status determiner 1246A and an erase method selector 1246B.

When it is determined that the free block count FB_count is less than a second set number which is less than the first set number or that the performance of the memory system is below a set capability, the system status determiner 1246A may determine the memory system to be in an emergency state, and may control the memory system to preferentially perform a garbage collection operation as a foreground operation.

The erase method selector 1246B may set an erase method for victim blocks to a multi-erase method or a single-erase method based on the number of selected victim blocks (i.e. victim block count). In an embodiment, the garbage collection controller 1246 may set the erase method for victim blocks to a multi-erase method or a single-erase method based on the valid data information Data_Amount stored in the victim blocks received from the valid data counter 1244.

The garbage collection controller 1246 may generate the garbage collection command GC_CMD based on the garbage collection operation type selected by the system status determiner 1246A and the erase method selected by the erase method selector 1246B. The garbage collection command GC_CMD may be configured to contain the information about victim blocks, the information about target memory blocks, and the information about the erase method for victim blocks.

Figure 4:
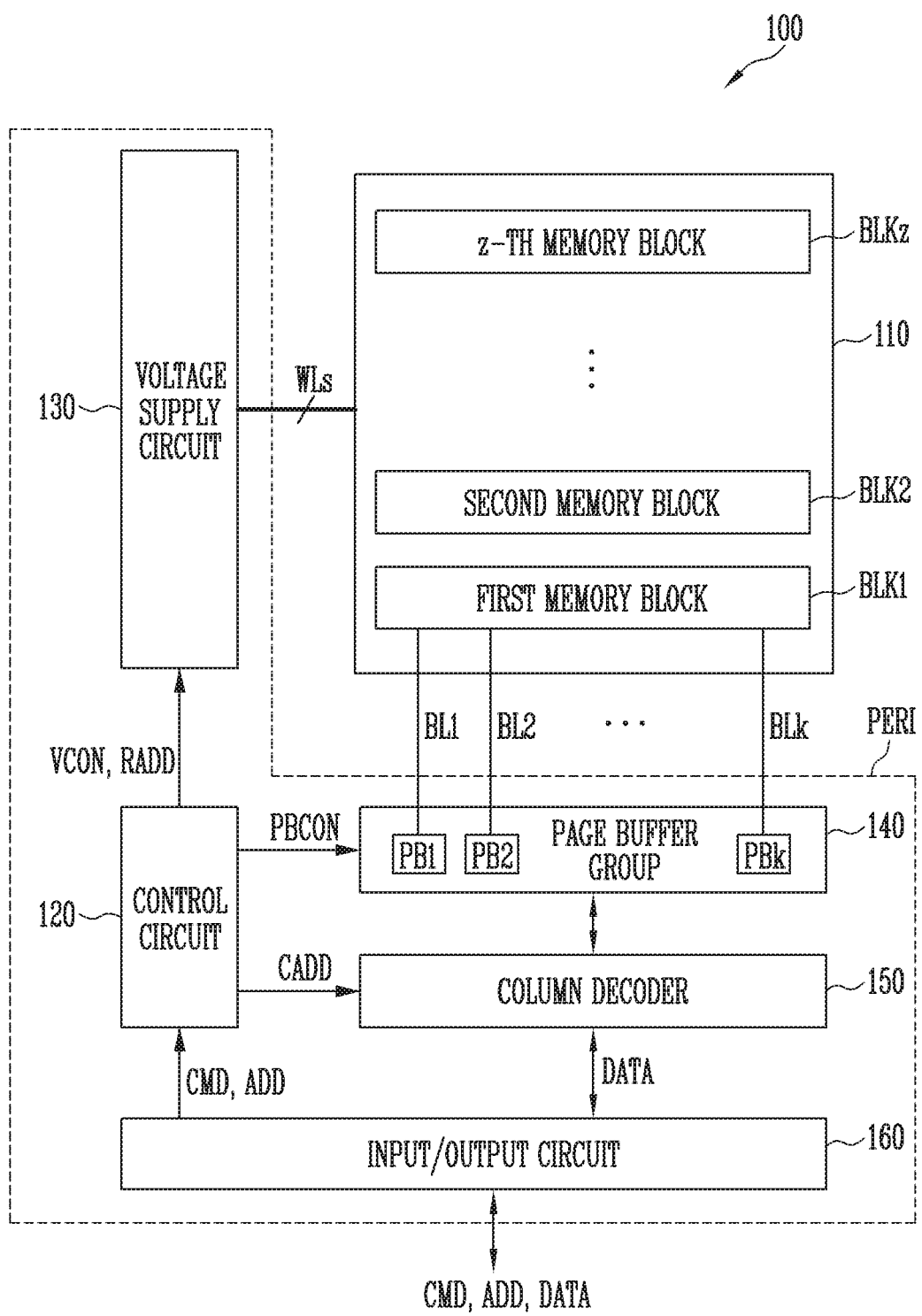
FIG. 4 illustrates a semiconductor memory of FIG. 1 according to various embodiments of the present disclosure.

FIG. 4 is a block diagram illustrating the semiconductor memory of FIG. 1.

Referring to FIG. 4, the semiconductor memory 100 may include a memory cell array 110 including a plurality of memory blocks BLK1 to BLKz and a peripheral circuit PERI configured to perform a program operation, a read operation or an erase operation on memory cells included in a selected page of the plurality of memory blocks BLK1 to BLKz. The peripheral circuit PERI may include a control circuit 120, a voltage supply circuit 130, a page buffer group 140, a column decoder 150, and an input/output circuit 160.

The memory cell array 110 may include a plurality of memory blocks BLK1 to BLKz. Each of the memory blocks BLK1 to BLKz may include a plurality of pages. Each of the plurality of pages may include a plurality of memory cells. In an embodiment, the plurality of memory cells may be nonvolatile memory cells. This will be described in detail below with reference to FIGS. 5 and 6.

The control circuit 120 may output a voltage control signal VCON to generate voltages necessary to perform a read operation, a program operation or an erase operation in response to an internal command CMD that is externally input through the input/output circuit 160, and may output a page buffer (PB) control signal PBCON to control page buffers PB1 to PBk included in the page buffer group 140 depending on the type of operation. Also, the control circuit 120 may output row address signals RADD and column address signals CADD in response to an address signal ADD that is externally input through the input/output circuit 160.

The voltage supply circuit 130 may supply operating voltages required for a program operation, a read operation or an erase operation performed on memory cells to local lines including a drain select line, word lines WLs, and a source select line of a selected memory block in response to the voltage control signal VCON from the control circuit 120. The voltage supply circuit 130 may include a voltage generation circuit and a row decoder. In an example, the erase voltage for the erase operation may be applied to a source line of the plurality of memory blocks BLK1 to BLKz included in the memory cell array 110 or to a well substrate of the plurality of memory blocks BLK1 to BLKz.

The voltage generation circuit may output the operating voltages required for the program operation, the read operation, and the erase operation performed on the memory cells to global lines in response to the voltage control signal VCON from the control circuit 120.

The row decoder may couple the global lines to the local lines so that the operating voltages, which are output from the voltage generation circuit to the global lines, can be transferred to the local lines of the memory block selected from the memory cell array 110 in response to the row address signals RADD from the control circuit 120.

The page buffer group 140 may include the plurality of page buffers PB1 to PBk coupled to the memory cell array 110 through bit lines BL1 to BLk, respectively. The page buffers PB1 to PBk of the page buffer group 140 may selectively precharge the bit lines BL1 to BLk depending on data DATA to be stored into memory cells, or may sense the voltages of the bit lines BL1 to BLk to read data DATA from the memory cells, in response to the PB control signal PBCON from the control circuit 120.

The column decoder 150 may select the page buffers PB1 to PBk included in the page buffer group 140 in response to the column address signals CADD from the control circuit 120. That is, the column decoder 150 may sequentially transfer data DATA to be stored in the memory cells to the page buffers PB1 to PBk in response to the column address signals CADD. Further, the column decoder 150 may sequentially select the page buffers PB1 to PBk in response to the column address signals CADD so that the data DATA of the memory cells, latched in the page buffers PB1 to PBk, can be output to an external device through a read operation.

The input/output circuit 160 may transfer input data DATA to the column decoder 150 under the control of the control circuit 120 so that the input data DATA can be input to the page buffer group 140 in order to store the data into memory cells during a program operation. When the column decoder 150 transfers the data DATA received from the input/output circuit 160 to the page buffers PB1 to PBk of the page buffer group 140, the page buffers PB1 to PBk may store the received data DATA in internal latch circuits thereof. Furthermore, during a read operation, the input/output circuit 160 may output the data DATA, transferred from the page buffers PB1 to PBk of the page buffer group 140 through the column decoder 150, to an external device.

Figure 5:
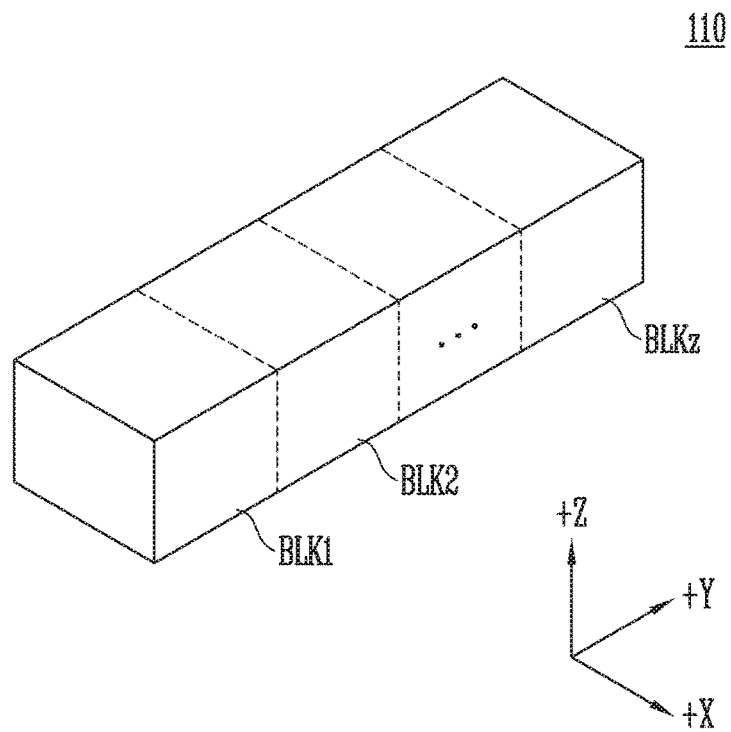
FIG. 5 is a block diagram illustrating an embodiment of a memory cell array of FIG. 4 according to various embodiments of the present disclosure.

FIG. 5 is a block diagram illustrating an embodiment of the memory cell array of FIG. 4.

Referring to FIG. 5, the memory cell array 110 may include a plurality of memory blocks BLK1 to BLKz. Each memory block may have a three-dimensional (3D) structure. Each of the memory blocks may include a plurality of memory cells stacked on a substrate. The plurality of memory cells may be arranged in +X, +Y, and +Z directions. The structure of each memory block will be described in greater detail below with reference to FIG. 6.

Figure 6:
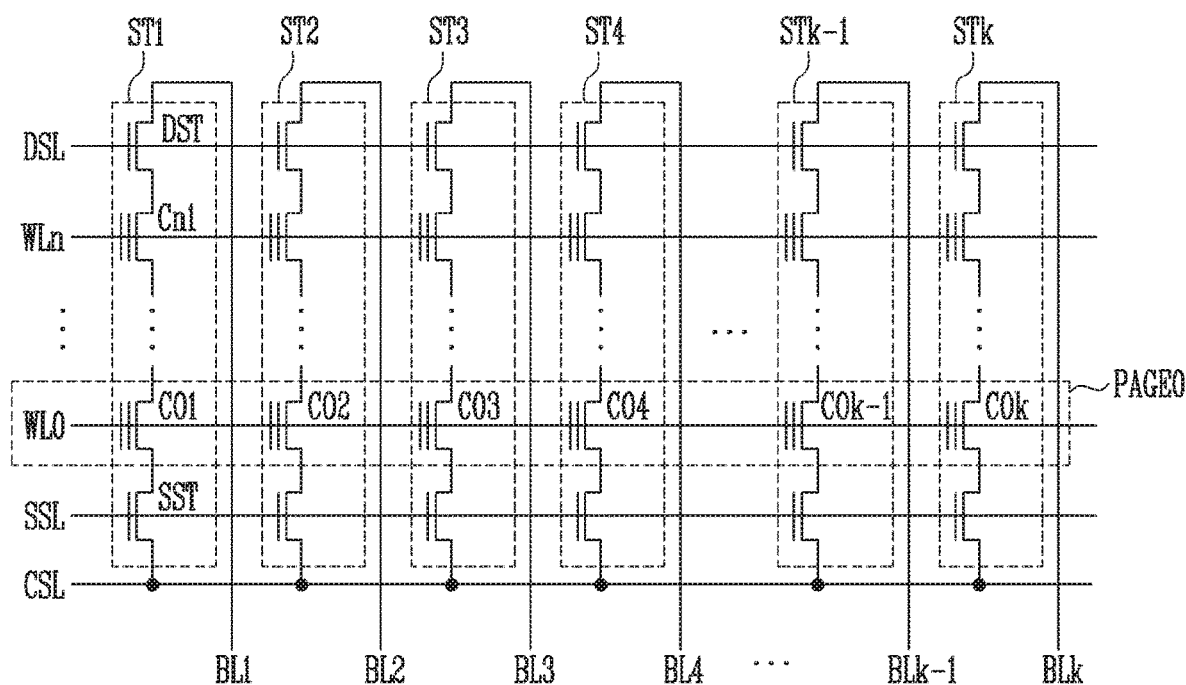
FIG. 6 is a circuit diagram illustrating a memory block of FIG. 5 according to various embodiments of the present disclosure.

FIG. 6 is a circuit diagram illustrating the memory block of FIG. 5.

Referring to FIG. 6, each memory block may include a plurality of strings ST1 to STk which are coupled between bit lines BL1 to BLk and a common source line CSL. That is, the strings ST1 to STk may be coupled to the corresponding bit lines BL1 to BLk, respectively, and may be coupled in common to the common source line CSL. Each string (e.g., ST1) may include a source select transistor SST, a source of which is coupled to the common source line CSL, a plurality of memory cells C01 to Cn1, and a drain select transistor DST, a drain of which is coupled to the corresponding bit line BL1. The memory cells C01 to Cn1 may be coupled in series between the select transistors SST and DST. A gate of the source select transistor SST may be coupled to a source select line SSL. Gates of the memory cells C01 to Cn1 may be coupled to word lines WL0 to WLn, respectively. A gate of the drain select transistor DST may be coupled to a drain select line DSL.

The memory cells included in the memory block may be classified into a physical page unit or a logical page unit. For example, memory cells C01 to C0k k coupled to a single word line (e.g., WL0) may constitute a single physical page PAGE0.

Figure 7:
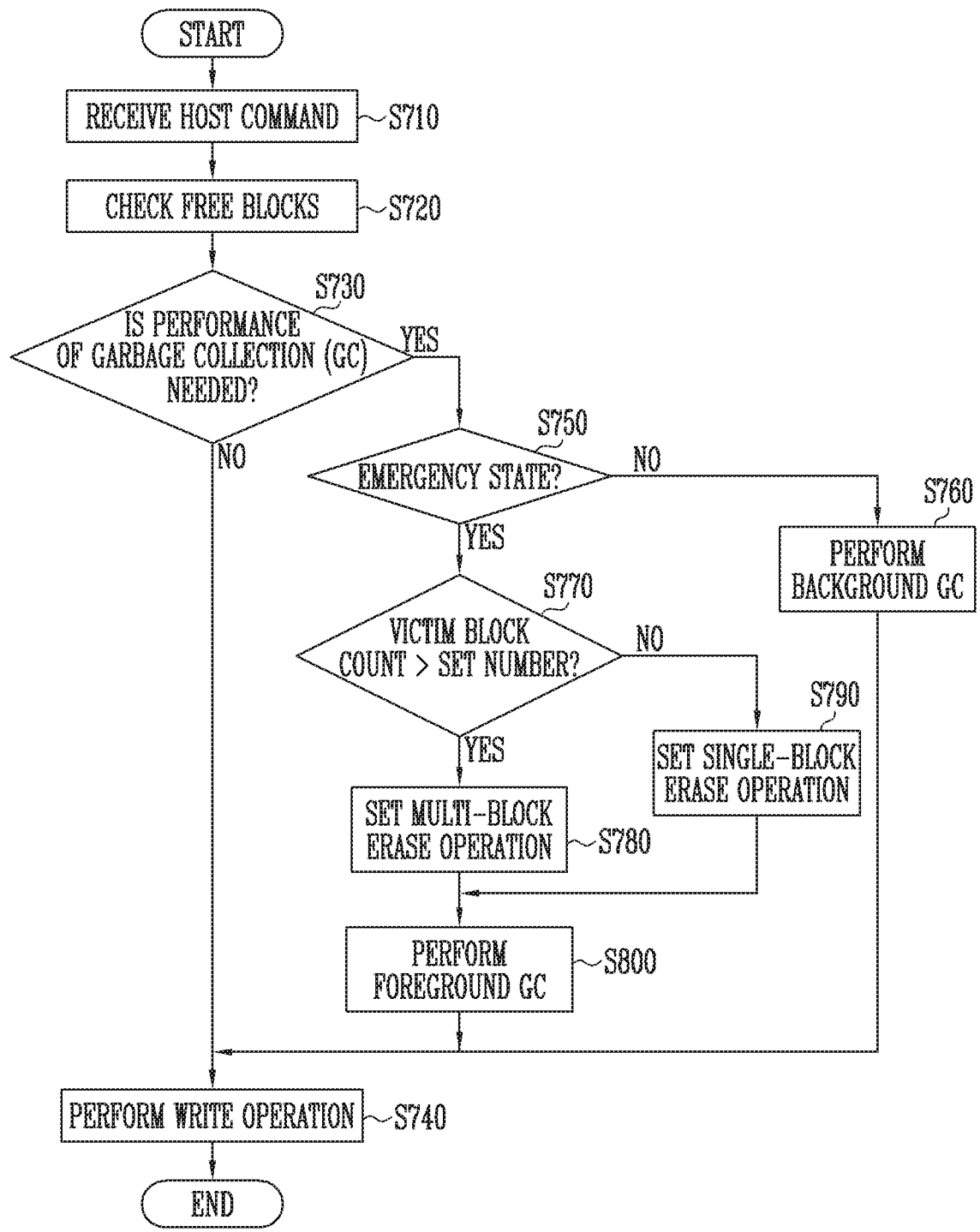
FIG. 7 is a flowchart illustrating the operation of a memory system according to various embodiments of the present disclosure.

FIG. 7 is a flowchart illustrating the operation of a memory system according to various embodiments of the present disclosure.

The operation of the memory system according to various embodiments of the present disclosure will be described below with reference to FIGS. 1 to 7.

The host 1300 may generate and output a host command Host_CMD and data DATA corresponding to a write operation, and the memory controller 1200 may receive the host command Host_CMD and the data DATA from the host 1300 at step S710.

The processor 1220 of the memory controller 1200 may generate a command queue (Command Que) by parsing the host command Host_CMD received through the host control block 1210. The processor 1220 may map the address ADD, received together with the host command Host_CMD, to the physical address of the memory device. The write buffer 1231 of the buffer memory 1230 may receive the data DATA from the host 1300 through the host control block 1210 to store the received data DATA.

The garbage collection control block 1240 may check free blocks, among the memory blocks BLK1 to BLKz of the plurality of semiconductor memories 100 included in the memory device 1100, at step S720.

Based on the result of checking the free blocks, it may be determined as to whether a garbage collection (GC) operation needs to be performed at step S730. For example, when the number of free blocks (a checked free block count) is less than a first set number, it may be determined that a garbage collection operation (GC) needs to be performed (in case of Yes), whereas when the free block count is equal to or greater than the first set number, it may be determined that the garbage collection operation (GC) does not need to be performed (in case of No).

When it is determined at step S730 that the performance of the garbage collection operation (GC) does not need to be performed (in case of No), the flash control block 1260 may generate an internal command CMD for controlling a write operation of the memory device 1100 in response to the command queue (Command Que) generated by the processor 1220, and may output the internal command CMD. The flash control block 1260 may transmit the data buffered in the write buffer 1231 of the buffer memory 1230, to the memory device 1100 during a write operation. Here, the flash control block 1260 may output the address ADD mapped by the processor 1220, together with the internal command CMD and the data DATA.

The memory device 1100 may receive the internal command CMD, the address ADD, and the data DATA from the memory controller 1200, and perform a write operation on a selected memory block (i.e., at least one of the memory blocks BLK1 to BLKz) in a selected semiconductor memory 100 in response to the received internal command CMD, address ADD, and data DATA at step S740.

When it is determined at step S730 that the garbage collection operation (GC) needs to be performed (in case of Yes), the garbage collection control block 1240 may check the current performance of the memory system 1000, and then determine whether the memory system 1000 is in an emergency state at step S750. For example, when the free block count is less than a second set number, the garbage collection control block 1240 may determine that the memory system 1000 is in an emergency state. The second set number may be less than the first set number. Although the embodiment of the present disclosure described above illustrates that an emergency state is determined based on the free block count, the present disclosure is not limited thereto. The status of the memory system may be determined by using a plurality of methods for determining the performance of the memory system.

When it is determined at step S750 that the memory system 1000 is not in an emergency state (in case of No), the garbage collection control block 1240 may generate and output a background garbage collection command GC_CMD. The flash control block 1260 may control the memory device 1100 so that the memory device 1100 can perform a garbage collection operation in response to the garbage collection command GC_CMD. The memory device 1100 may perform a background garbage collection (GC) operation when the memory system 1000 is in an idle state, under the control of the flash control block 1260 at step S760. The garbage collection operation will be described below with reference to FIG. 8.

When it is determined at step S750 that the memory system 1000 is in an emergency state (in case of Yes), the garbage collection controller 1246 may compare the number of victim blocks (i.e. victim block count) selected by the victim block selector 1243 with a set number at step S770. For example, the garbage collection controller 1246 may determine whether the number of victim blocks selected by the victim block selector 1243 is greater than the set number.

When, as a result of the comparison operation at step S770, the number of victim blocks is greater than the set number (in case of Yes), the garbage collection controller 1246 may set an erase method for victim blocks to a multi-erase method during the garbage collection operation at step S780.

In contrast, when the number of victim blocks is less than or equal to the set number (in case of No), the garbage collection controller 1246 may set the erase method for victim blocks to a single-erase method during the garbage collection operation at step S790.

After the above-described multi-block erase (multi-erase) setting step S780 or the single-block erase (single-erase) setting step S790, the garbage collection control block 1240 may generate and output a foreground garbage collection command GC_CMD. The garbage collection command GC_CMD may be configured to contain the information about victim blocks, the information about target memory blocks, and the information about the erase method for victim blocks. The flash control block 1260 may control the memory device 1100 to perform a garbage collection operation in response to the garbage collection command GC_CMD. Here, the flash control block 1260 may process the garbage collection command GC_CMD prior to other commands queued in the command queue (Command Que) generated by the processor 1220. Therefore, the flash control block 1260 may control the memory device 1100 to perform the garbage collection operation as a foreground operation prior to a write operation.

The memory device 1100 may perform a foreground garbage collection operation under the control of the flash control block 1260 at step S800. After the storage of valid data from the victim blocks into the target memory block has been completed, the memory device 1100 may erase data of the victim blocks in such a way as to erase data of the plurality of victim blocks using a multi-erase method or a single-erase method based on the above-set erase method.

After completing the garbage collection operation, the above-described write operation may be performed at step S740.

Figure 8:
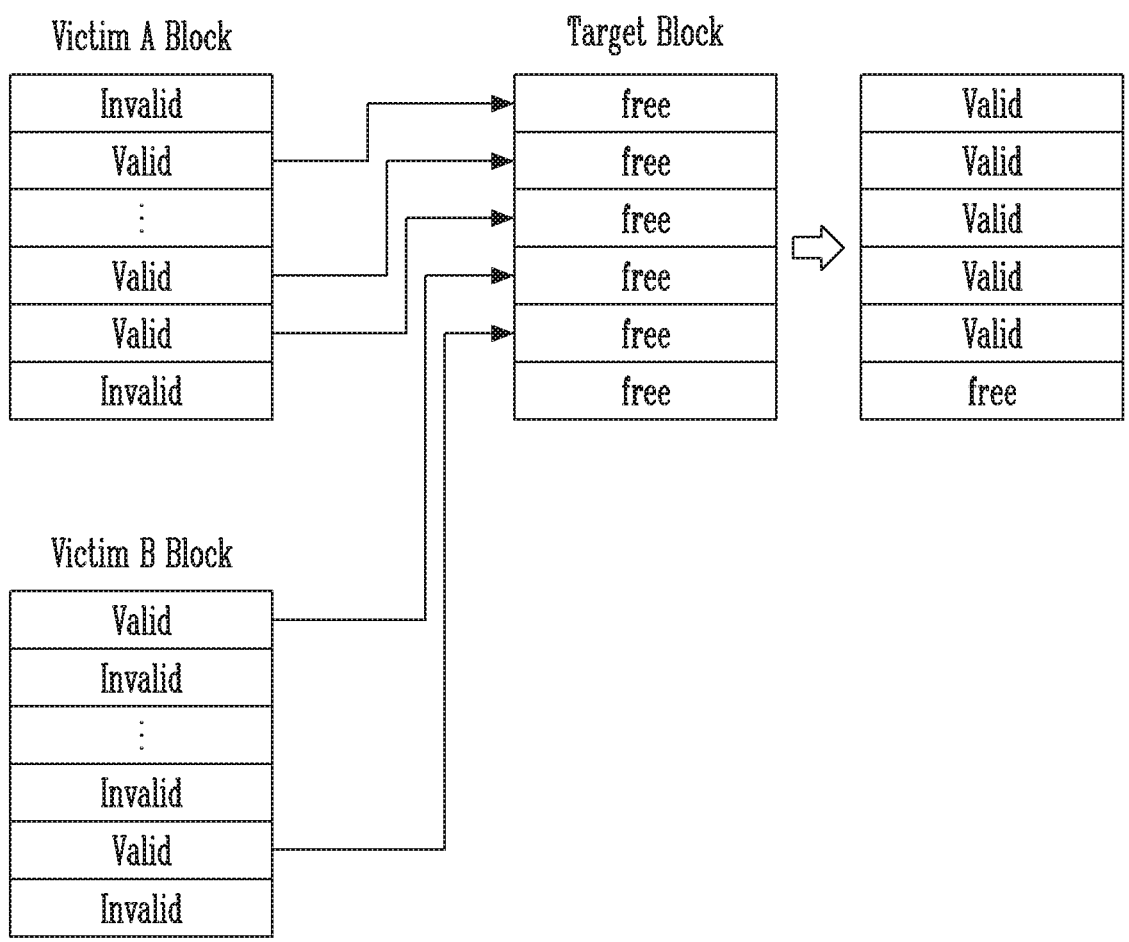
FIG. 8 illustrates an operation of storing data of victim blocks in a target memory block during a garbage collection operation according to various embodiments of the present disclosure.

FIG. 8 is a diagram for describing an operation of storing data of victim blocks into a target memory block during a garbage collection operation.

In an embodiment of the present disclosure, a case where valid data in a victim A block and a victim B block is copied into a target memory block will be described by way of example.

Referring to FIG. 8, a plurality of pages included in the victim A block may include a plurality of valid pages for storing valid data and a plurality of invalid pages for storing invalid data. Also, a plurality of pages included in the victim B block may include a plurality valid pages for storing valid data and a plurality of invalid pages for storing invalid data.

As the target memory block, one of free blocks in the memory blocks may be selected, and thus the target memory block may be composed of pages in an erased state (i.e., free pages) in which data is not stored.

During the garbage collection operation, data may be read from the valid pages in which valid data is stored, among a plurality of pages included in the victim A block and the victim B block. Data read from the valid pages may be stored in the read buffer 1232 of FIG. 2, and the valid data stored in the read buffer 1232 may be stored into the target memory block, page by page. That is, the valid data stored in the plurality of victim blocks may be copied into the target memory block. Therefore, all of the valid data stored in the plurality of victim blocks may be stored into a smaller number of target memory blocks than the number of victim blocks.

The victim A block and the victim B block, the valid data of which has been stored in the target memory block, are erased to become free blocks.

Figure 9:
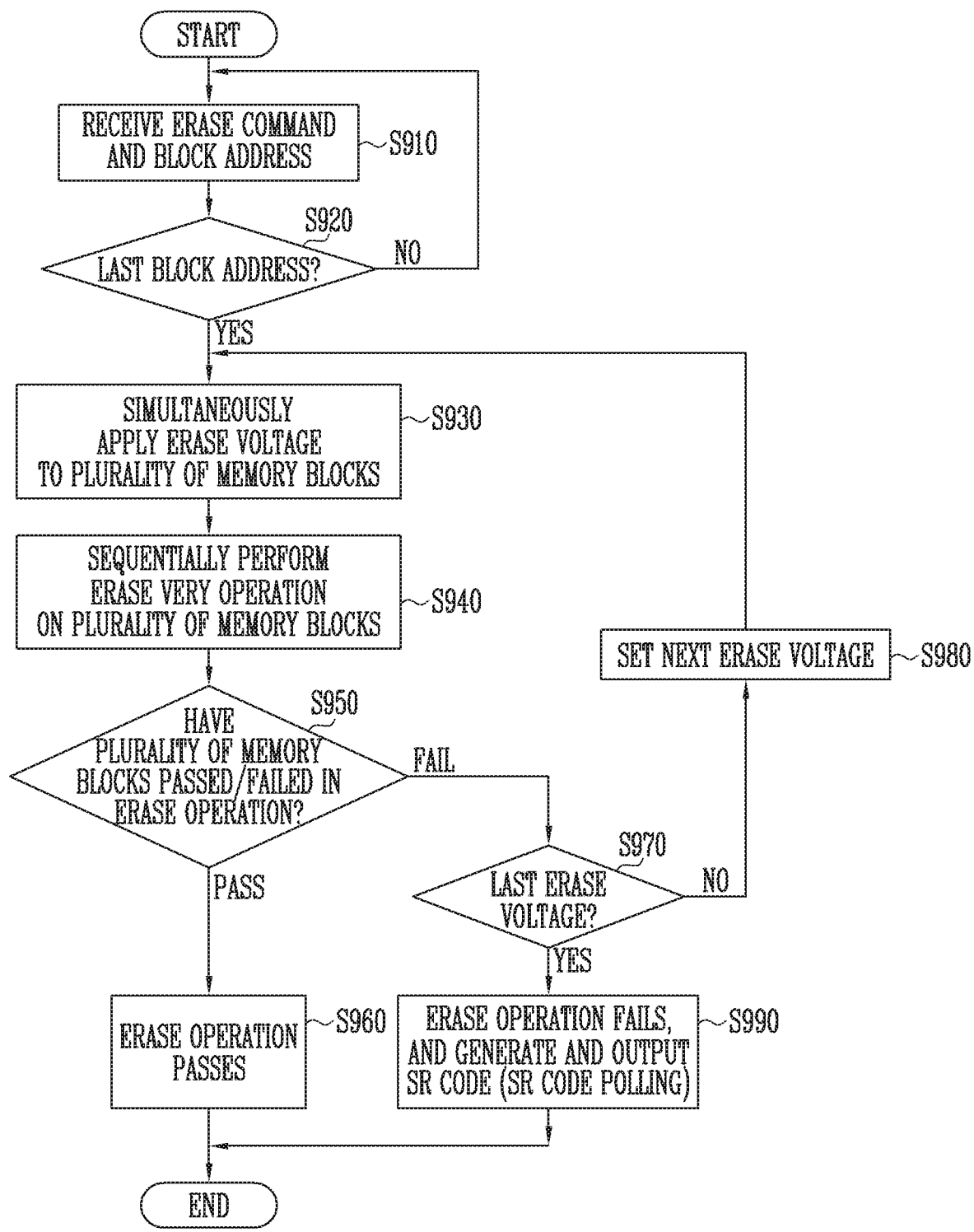
FIG. 9 is a flowchart illustrating a method of erasing a plurality of victim blocks using a multi-erase method during a garbage collection operation according to various embodiments of the present disclosure.

FIG. 9 is a flowchart illustrating a method of erasing a plurality of victim blocks using a multi-erase method during a garbage collection operation according to various embodiments of the present disclosure.

FIG. 10 is a timing diagram of an erase command, a block address, and a ready/busy signal for describing a multi-erase operation according to various embodiments of the present disclosure.

FIG. 11 is a waveform diagram of signals for describing a multi-erase operation according to various embodiments of the present disclosure.

A multi-erase method according to various embodiments of the present disclosure will be described below with reference to FIGS. 4 and 9 to 11.

In the embodiment of the present disclosure, a case where an erase operation is performed on a plurality of memory blocks, for example, block N, block M, and block K using a multi-erase method will be described by way of example.

The semiconductor memory 100 may receive an erase command 60*h* and a first block address BLOCK N from a memory controller (e.g., 1200 of FIG. 1) through an input/output line (I/O) at step S910.

Whether or not the received block address is a last address is determined at step S920. When the received block address is not a last address (in case of No), the semiconductor memory 100 may receive the erase command 60*h* and a next block address BLOCK M.

When an address input completion signal D0*h* is received, and it is determined that the last erase command 60*h* and a block address BLOCK K have been received (in case of Yes), the control circuit 120 may perform a multi-erase operation on the block N, the block M, and the block K in response to the received erase command CMD 60*h* and the block addresses ADD (e.g., BLOCK N, BLOCK M, AND BLOCK K).

This operation will be described in detail below.

The control circuit 120 may control the voltage supply circuit 130 to simultaneously apply an erase voltage to the plurality of memory blocks (e.g., block N, block M, and block K) at step S930. In an embodiment of the present disclosure, it will be described by way of example that an erase voltage apply operation is performed using an Incremental Step Pulse Erase (ISPE) method of applying an erase voltage while gradually increasing the erase voltage.

The voltage supply circuit 130 may generate a first erase voltage Vera 1 to be applied to the plurality of memory blocks (e.g., block N, block M, and block K) selected for an erase operation in response to a voltage control signal VCON output from the control circuit 120, and may apply the generated first erase voltage Vera 1 to the plurality of selected memory blocks (e.g., block N, block M, and block K). The first erase voltage Vera 1 may be applied to the source line SL of the selected memory blocks (e.g., block N, block M, and block K). In an embodiment, the first erase voltage Vera 1 may be applied to the substrate of the selected memory blocks (e.g., block N, block M, and block K).

The control circuit 120 may control the voltage supply circuit 130 and the page buffer group 140 so that the plurality of memory blocks (e.g., block N, block M, and block K) sequentially perform a verifying operation at step S940.

In order to perform an erase verifying operation on block N, the voltage supply circuit 130 may generate a first erase verifying voltage Vverify_N to apply the first erase verifying voltage Vverify_N to word lines WLs of block N. The page buffer group 140 may sense voltages or currents through bit lines BL1 to BLk coupled to block N, determine the result of the erase verifying operation on block N, and then output the determined result to the control circuit 120. The control circuit 120 may store the status of block N (compress status_N) depending on the result of the erase verifying operation on block N.

Thereafter, in order to perform an erase verifying operation on block M which is a block next to block N, the voltage supply circuit 130 may generate a second erase verifying voltage Vverify_M and apply the generated second erase verifying voltage Vverify_M to word lines WLs of block M. The page buffer group 140 may sense voltages or currents through bit lines BL1 to BLk coupled to block M, determine the result of the erase verifying operation on block M, and output the determined result to the control circuit 120. The control circuit 120 may store the status of block M (compress status_M) depending on the result of the erase verifying operation on block M.

Thereafter, in order to perform an erase verifying operation on block K which is a block next to block M, the voltage supply circuit 130 may generate a third erase verifying voltage Vverify_K and apply the third erase verifying voltage Vverify_K to word lines WLs of block K. The page buffer group 140 may sense voltages or currents through bit lines BL1 to BLk coupled to block K, determine the result of the erase verifying operation on block K, and output the determined result to the control circuit 120. The control circuit 120 may store the status of block K (compress status_K) depending on the result of the erase verifying operation on block K.

Thereafter, determining whether the erase operation has passed or failed is based on the status of the plurality of memory blocks (e.g., block N, block M, and block K) at step S950. For example, when the status of block N (compress status_N), of block M (compress status_M), and of block K (compress status_K) are in an erase-completed state, the erase operation may be determined to have passed. In contrast, when at least one of the status of block N (compress status_N), of block M (compress status_M), and of block K (compress status_K) is not in an erase-completed state, the erase operation may be determined to have failed.

The above-described steps S930 to S950 may be performed during a period in which the memory device is in a busy state, that is, in which a ready/busy signal R/B is activated to a low level. Further, an erase time tBER may be decreased by simultaneously applying the erase voltage to the plurality of memory blocks.

When the result at the above-described determination step S950 indicates a pass of the erase operation (in case of Pass), the control circuit 120 may determine that the erase operation on the plurality of memory blocks (e.g., block N, block M, and block K) has been completed in a pass state at step S960, generate a response signal corresponding to the pass state, and output the response signal to the memory controller 1200 of FIG. 1.

When the result at the above-described determination step S950 indicates a fail of the erase operation (in case of Fail), it is determined as to whether the erase voltage used at previous step S930 is a last erase voltage (e.g., Vera_end) set by the ISPE method at step S970.

When the erase voltage used at previous step S930 is not a last erase voltage (in case of No), a next erase voltage (e.g., a second erase voltage Vera 2) may be set at step S980. The next erase voltage may be a voltage increased from the previous erase voltage by a step voltage ΔV. Thereafter, a procedure from the above-described erase voltage apply step S930 may be re-performed using the newly set erase voltage.

When the erase voltage used at previous step S930 indicates the last erase voltage (in case of Yes), the control circuit 120 may determine that the erase operation on the plurality of memory blocks (e.g., block N, block M, and block K) has failed, generate a response signal 70*h* and a status register (SR) code corresponding to the fail state, and output the generated signal and code to the memory controller 1200 of FIG. 1 at step S990.

As described above, in accordance with various embodiments of the present disclosure, when an erase operation is performed on a plurality of victim blocks using a multi-erase method during the garbage collection operation, time required for the erase operation may be decreased. Thus, during the garbage collection operation, free blocks may be rapidly secured, and the performance of the memory system may be advantageously improved.

FIG. 12 is a diagram for describing a map table for a target memory block during a garbage collection operation according to various embodiments of the present disclosure.

When data stored in victim blocks is copied into a target memory block during a garbage collection operation of the memory system, logical addresses of data to be stored into the target memory block and physical addresses of the target memory block may be mapped to each other, and the data may be stored into areas corresponding to the mapped physical addresses.

Here, it should be noted from map tables for the victim blocks that logical addresses (0, 1, 2, . . . , 201) may be randomly arranged. That is, physical addresses matching logical addresses which are adjacent to each other, may not be adjacent to each other.

Therefore, the mapping operation may be performed such that, when the logical addresses of data to be stored into the target memory block are mapped to the physical addresses of the target memory block, adjacent logical addresses can be mapped to adjacent physical addresses. For example, after the logical addresses are sequentially aligned, the aligned logical addresses may be sequentially mapped to the physical addresses.

Accordingly, the target memory block may store data corresponding to logical addresses adjacent to each other. After time has elapsed, when the corresponding target memory block is selected as a victim block, data corresponding to the adjacent logical addresses may be stored into physically adjacent areas, and thus a read operation for valid data may be facilitated. Furthermore, since victim blocks that are arranged physically adjacent to each other may be selected during the garbage collection operation, the multi-block erase operation (multi-erase operation) may be easily performed.

Figure 13:
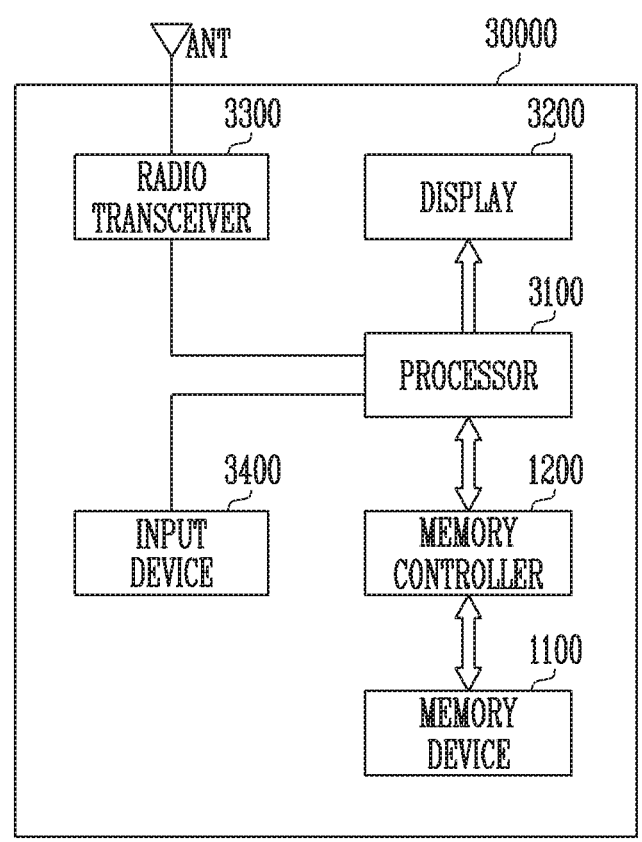
FIG. 13 illustrates a first exemplary memory system according to various embodiments of the present disclosure.

FIG. 13 is a diagram illustrating an embodiment of a memory system according to the present disclosure.

Referring to FIG. 13, a memory system 30000 may be embodied in a cellular phone, a smartphone, a tablet PC, a personal digital assistant (PDA) or a wireless communication device. The memory system 30000 may include a memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be output through a display 3200 under the control of the memory controller 1200.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad, a computer mouse, a keypad or a keyboard. The processor 3100 may control the operation of the display 3200 such that data output from the memory controller 1200, data from the radio transceiver 3300 or data from the input device 3400 is output through the display 3200.

In an embodiment, the memory controller 1200 capable of controlling the operation of the memory device 1100 may be implemented as a part of the processor 3100 or a chip provided separately from the processor 3100. Further, the memory controller 1200 may be implemented through the example of the memory controller 1200 illustrated in FIG. 2.

Figure 14:
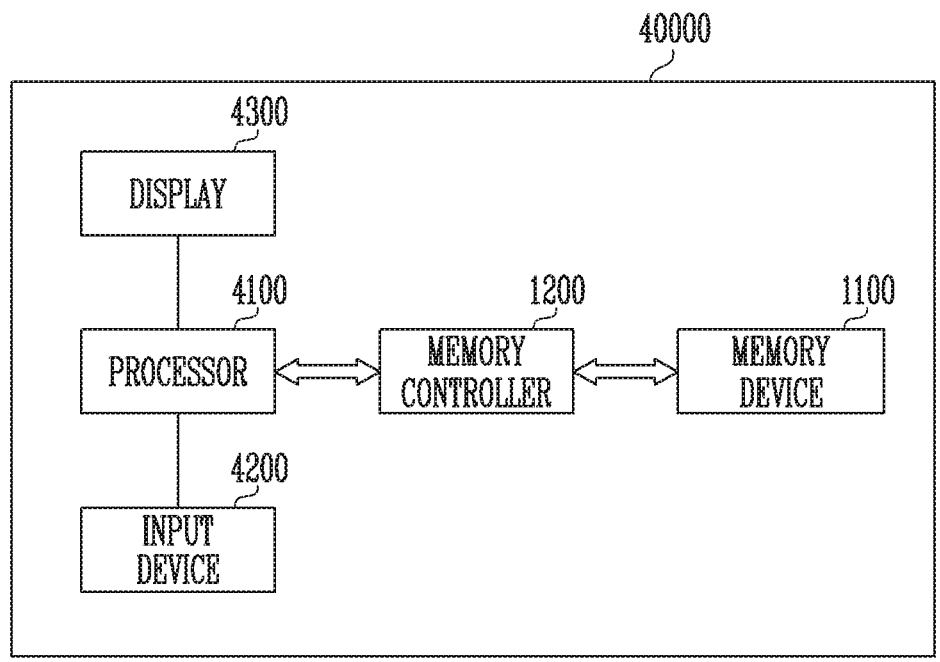
FIG. 14 illustrates a second exemplary memory system according to various embodiments of the present disclosure.

FIG. 14 is a diagram illustrating an embodiment of a memory system according to the present disclosure.

Referring to FIG. 14, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling the data processing operation of the memory device 1100.

A processor 4100 may output data stored in the memory device 1100 through a display 4300, according to data input from an input device 4200. For example, the input device 4200 may be implemented as a pointing device such as a touch pad, a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100. Further, the memory controller 1200 may be implemented through the example of the memory controller 1200 illustrated in FIG. 2.

Figure 15:
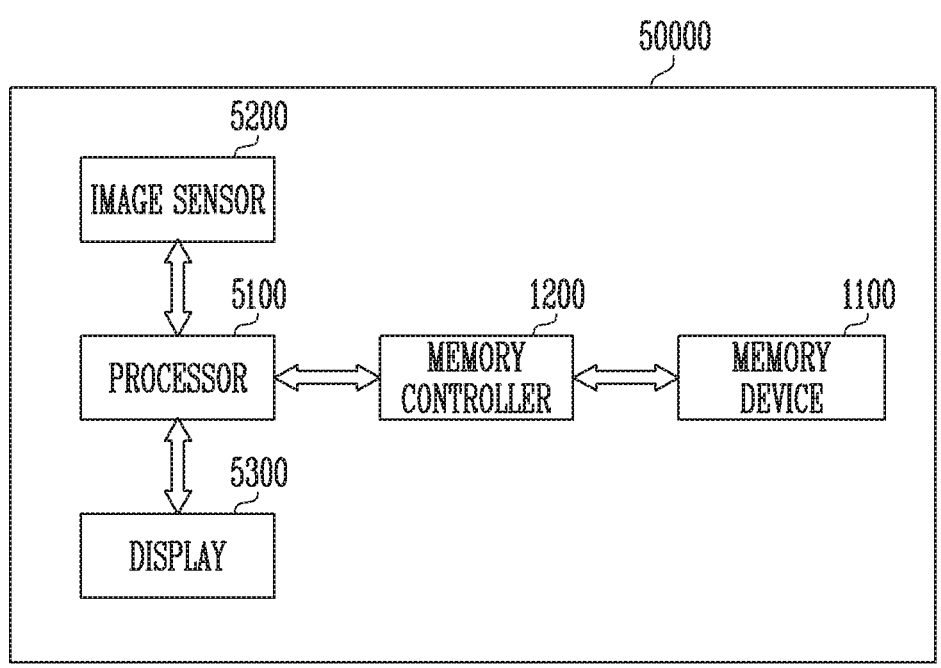
FIG. 15 illustrates a third exemplary memory system according to various embodiments of the present disclosure.

FIG. 15 is a diagram illustrating an embodiment of a memory system according to the present disclosure.

Referring to FIG. 15, a memory system 50000 may be embodied in an image processing device, e.g., a digital camera, a portable phone provided with a digital camera, a smartphone provided with a digital camera, or a tablet PC provided with a digital camera.

The memory system 50000 may include a memory device 1100 and a memory controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be output through a display 5300 or stored in the memory device 1100 through the memory controller 1200. Data stored in the memory device 1100 may be output through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100. Further, the memory controller 1200 may be implemented through the example of the memory controller 1200 illustrated in FIG. 2.

Figure 16:
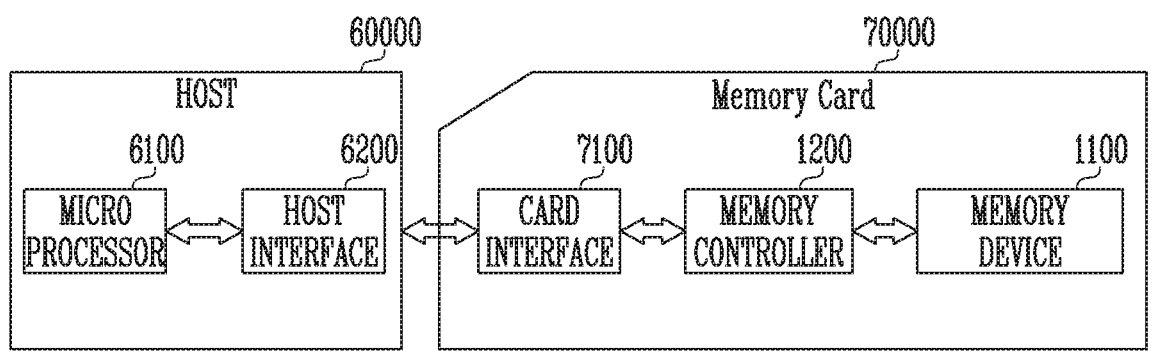
FIG. 16 illustrates a fourth exemplary memory system according to various embodiments of the present disclosure.

FIG. 16 is a diagram illustrating an embodiment of a memory system according to the present disclosure.

Referring to FIG. 16, a memory system 70000 may be embodied in a memory card or a smart card. The memory system 70000 may include a memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto. Further, the memory controller 1200 may be implemented through the example of the memory controller 1200 illustrated in FIG. 2.

The card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. The card interface may refer to hardware capable of supporting a protocol which is used by the host 60000, software installed in the hardware, or a signal transmission method.

When the memory system 70000 is coupled to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

The present disclosure may rapidly secure free blocks by storing valid data of victim blocks in a target memory block and then simultaneously erasing the victim blocks during a garbage collection operation of a memory system, thus improving the performance of the memory system.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

What is claimed is:

1. A memory system, comprising:
a memory device configured to include a plurality of memory blocks and copy data stored in victim blocks among the plurality of memory blocks, into a target memory block during a garbage collection operation; and
a memory controller configured to control the memory device to perform the garbage collection operation, and, during the garbage collection operation, to erase the data stored in the victim blocks using a multi-erase method or a single-erase method,
wherein the multi-erase method includes an operation of simultaneously applying an erase voltage to the victim blocks, and
wherein the memory controller is configured to control the memory device to erase the data stored in the victim blocks using the multi-erase method when a number of victim blocks is greater than a set number, and control the memory device to erase the data stored in the victim blocks using the single-erase method for sequentially erasing the victim blocks when the number of victim blocks is less than or equal to the set number.

2. The memory system according to claim 1, wherein the memory device is configured to read valid data from the data stored in the victim blocks during the garbage collection operation, store the read valid data into the target memory block, and then erase the data stored in the victim blocks using the multi-erase method.

3. The memory system according to claim 1, wherein the memory controller comprises:
a processor configured to generate a command queue in response to a host command received from a host;
a garbage collection control block configured to generate a garbage collection command which controls performing the garbage collection operation based on a number of free blocks, among the plurality of memory blocks included in the memory device; and
a flash control block configured to generate and output an internal command for controlling the memory device in response to the command queue and the garbage collection command.

4. The memory system according to claim 3, wherein
the memory controller further comprises a buffer memory configured to store valid data read from the victim blocks during the garbage collection operation, and
wherein the buffer memory stores respective map tables for the plurality of memory blocks included in the memory device.

5. The memory system according to claim 4, wherein the processor updates the map table for the target memory block by sequentially aligning logical addresses of the valid data stored in the victim blocks and then sequentially mapping the aligned logical addresses to physical addresses of the target memory block during the garbage collection operation.

6. A memory system, comprising:
a memory device having a plurality of memory blocks, and configured to copy data stored in victim blocks among the plurality of memory blocks, into a target memory block among the plurality of memory blocks, and erasing the data stored in the victim blocks using a single-erase method or a multi-erase method during a garbage collection operation; and
a memory controller configured to control the memory device to perform the garbage collection operation, set an erase method for the victim blocks to the single-erase method or the multi-erase method based on an amount of valid data stored in the victim blocks during the garbage collection operation, and control the memory device to erase the data stored in the victim blocks using the set erase method,
wherein the multi-erase method includes an operation of simultaneously applying an erase voltage to the victim blocks, and
wherein the memory controller is configured to control the memory device to erase the data stored in the victim blocks using the multi-erase method when the amount of valid data stored in the victim blocks is greater than a set amount of data, and control the memory device to erase the data stored in the victim blocks using the single-erase method for sequentially erasing the victim blocks when the amount of valid data is less than or equal to the set amount of data.

7. The memory system according to claim 6, wherein the memory device is configured to read the valid data from the data stored in the victim blocks, store the read valid data into the memory controller, copy the valid data stored in the memory controller into the target memory block, and then erase the data stored in the victim blocks using the set erase method, during the garbage collection operation.

8. The memory system according to claim 6, wherein the memory device simultaneously applies the erase voltage to the victim blocks when erasing the data stored in the victim blocks using the multi-erase method.

9. The memory system according to claim 8, wherein the memory device is configured to, after applying the erase voltage to the victim blocks, sequentially perform an erase verifying operation on the victim blocks.

10. The memory system according to claim 6, wherein the memory controller comprises:
a processor configured to generate a command queue in response to a host command received from a host;
a garbage collection control block configured to generate a garbage collection command which controls performing the garbage collection operation based on a number of free blocks, among the plurality of memory blocks included in the memory device; and a flash control block configured to generate and output an internal command for controlling the memory device in response to the command queue and the garbage collection command.

11. The memory system according to claim 10, wherein the memory controller further comprises a buffer memory configured to store the valid data read from the victim blocks during the garbage collection operation, and wherein the buffer memory stores respective map tables for the plurality of memory blocks included in the memory device.

12. The memory system according to claim 11, wherein the processor updates a map table for the target memory block by mapping logical addresses of the valid data stored in the victim blocks to physical addresses of the target memory block during the garbage collection operation.

13. The memory system according to claim 12, wherein the processor maps the logical addresses of the valid data to the physical addresses of the target memory block in such a way as to sequentially align the logical addresses and then sequentially map the aligned logical addresses to the physical addresses.

14. The memory system according to claim 10, wherein the garbage collection control block comprises:
- a free block manager configured to manage free blocks, among the memory blocks and output information about the number of free blocks;
- a block count comparator configured to compare the number of free blocks with a first set number and then generate a garbage collection trigger signal;
- a victim block selector configured to select the victim blocks from among memory blocks in which the valid data is stored;
- a valid data counter configured to count the amount of valid data stored in the victim blocks;
- a target memory block selector configured to select the target memory block from among the free blocks; and
- a garbage collection controller configured to be activated in response to the garbage collection trigger signal, determine system performance based on the number of free blocks, determine to process the garbage collection operation in a background type or a foreground type, set the erase method for the victim blocks based on a number of victim blocks or the amount of valid data, and generate the garbage collection command based on the set erase method.

15. The memory system according to claim 14, wherein the garbage collection controller comprises:
- a system status determiner configured to determine the system performance by comparing the number of free blocks with a second set number, and to select the garbage collection operation as any one of the background type and the foreground type based on the determined system performance; and
- an erase method selector configured to select the erase method for the victim blocks as the single-erase method or the multi-erase method, based on the number of victim blocks or the amount of valid data.

16. A method of operating a memory system, comprising:
- determining whether to perform a garbage collection operation, based on a number of free blocks among a plurality of memory blocks included in a memory device;
- when it is determined that the garbage collection operation is to be performed, selecting victim blocks and a target memory block from among the plurality of memory blocks;
- reading valid data stored in the victim blocks and copying the read valid data into the target memory block; and
- erasing the valid data stored in the victim blocks using a multi-erase method when an amount of valid data stored in the victim blocks is greater than a set amount of data, and erasing the valid data stored in the victim blocks using a single-erase method for sequentially erasing the victim blocks when the amount of valid data is less than or equal to the set amount of data,
- wherein the multi-erase method includes an operation of simultaneously applying an erase voltage to the victim blocks.

17. The method according to claim 16, wherein the multi-erase method further includes, after applying the erase voltage to the victim blocks, an operation of sequentially performing an erase verifying operation on the victim blocks.

18. The method according to claim 16, further comprising:
- reading the valid data stored in the victim blocks, sequentially aligning logical addresses of the valid data, and then sequentially mapping the aligned logical addresses to physical addresses.

* * * * *